United States Patent
Thurairajaratnam et al.

(10) Patent No.: US 6,717,423 B1
(45) Date of Patent: Apr. 6, 2004

(54) SUBSTRATE IMPEDANCE MEASUREMENT

(75) Inventors: Aritharan Thurairajaratnam, San Jose, CA (US); Mohan R. Nagar, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/267,814

(22) Filed: Oct. 9, 2002

(51) Int. Cl.$^7$ .......................... G01R 31/02; G01R 31/26

(52) U.S. Cl. .................. 324/754; 324/757; 324/758; 324/765

(58) Field of Search ................................. 324/754–765

(56) References Cited

U.S. PATENT DOCUMENTS

| | | | |
|---|---|---|---|
| 5,461,324 A | * 10/1995 | Boyette et al. | 324/754 |
| 5,872,449 A | * 2/1999 | Gouravaram et al. | 324/158.1 |
| 6,066,561 A | * 5/2000 | Kumar et al. | 438/689 |
| 6,218,848 B1 | * 4/2001 | Hembree et al. | 324/754 |
| 6,484,884 B1 | * 11/2002 | Gerrity et al. | 209/233 |
| 6,507,204 B1 | * 1/2003 | Kanamaru et al. | 324/754 |

OTHER PUBLICATIONS

"Picoprobe Probe Cards", GGB Industries, Inc., Jun. 6, 2000.

* cited by examiner

*Primary Examiner*—Kamand Cuneo
*Assistant Examiner*—Emily Y Chan
(74) *Attorney, Agent, or Firm*—Luedeka, Neely & Graham, PC

(57) ABSTRACT

A probe structure with a connector connecting the probe structure to a time domain reflectometry tester, where the connector has a signal conductor and a ground conductor. A back side layer is connected to the connector. A probe side layer with contacts is sandwiched with the back side layer in a layered substrate. The probe side layer has a centrally disposed signal contact and surrounding ground contacts. A conductive layer is disposed between the back side layer and the probe side layer. The conductive layer is connected to the ground conductor of the connector and to the ground contacts of the probe side layer contacts. A via extends from the back side layer to the probe side layer. The via is connected to the signal conductor of the connector, and is also connected to the centrally disposed signal contact of the probe side layer contacts. The via does not make connection with the conductive layer. A first of pins is connected to the signal contact, for making a connection with a structure to be tested on the package substrate. Others of the pins are connected to the ground contacts, for making connections with structures on the package substrate that surround the structure to be tested.

20 Claims, 2 Drawing Sheets

SUBSTRATE IMPEDANCE MEASUREMENT

FIELD

This invention relates to the field of integrated circuit fabrication. More particularly, this invention relates to testing the characteristic impedance of integrated circuit package substrates.

BACKGROUND

As integrated circuits become increasingly faster, the structures used for conducting the signals must be fabricated to increasingly tighter tolerances so that they do not degrade or otherwise introduce unwanted characteristics into the signals which they conduct. Even the electrically nonconductive structures can effect the quality of the high speed signals passing through the conductive elements that are nearby. These tighter tolerances are important not only in the fabrication of the integrated circuits themselves, but also for the structures that are used to feed the signals to and from the integrated circuits, such as package components.

Obviously, if the conductive traces in a package substrate have shorts or opens, then the package substrate will function improperly. However, even seemingly minor imperfections can effect signal integrity at high signal speeds. For example, if such conductive traces are not of a uniform thickness and width along the length of the trace, then the impedance of the non uniform trace changes along its length. Thus, discontinuities in printed traces and connectors can degrade signal integrity. In addition, flaws in the non electrically conductive materials can introduce shorts and capacitances. Once problems like these occur, other problems begin to cascade, such as crosstalk, reflections, logic errors, and clock skew.

Time domain reflectometry is a method that is used to discover such problems in structures like integrated circuit package substrates. Time domain reflectometry uses a high speed digitizing oscilloscope with a built in step generator that launches a fast edge into a device under test, such as an electrical trace in a package substrate. By monitoring the reflected wave from various impedance discontinuities encountered in the substrate, different properties of the substrate, such as those mentioned above, can be sensed and analyzed. Time domain reflectometry uncovers such unwanted signal reflections so that defective substrates can be scrapped or reworked, and design flaws and process flaws can be corrected.

However, because time domain reflectometry is a very sensitive process, it is a relatively difficult and time consuming process. Therefore, only a few traces are typically tested on a substrate, because it is cost prohibitive to test a greater number. Therefore, a certain percentage of problems may remain undetected even after time domain reflectometry, because of the relatively few number of traces that are typically tested. Furthermore, in order to obtain tighter tolerances it is important to consider the variations in the entire package substrate.

What is needed, therefore, is a system by which time domain reflectometry can be performed on a greater number of package substrate traces without an extreme increase in time, so that problems with the traces can be detected prior to attachment and test or use of the integrated circuit.

SUMMARY

The above and other needs are met by a probe structure for testing the impedance of a package substrate using time domain reflectometry. A connector electrically connects the probe structure to a time domain reflectometry tester, where the connector has a signal conductor and a ground conductor. A non electrically conductive back side layer is physically connected to the connector. A non electrically conductive probe side layer with electrically conductive contacts is sandwiched with the non electrically conductive back side layer in a layered substrate. The non electrically conductive probe side layer has a centrally disposed signal electrical contact and surrounding ground electrical contacts.

An electrically conductive layer is disposed between the back side layer and the probe side layer. The electrically conductive layer is electrically connected to the ground conductor of the connector. The electrically conductive layer is also electrically connected to the ground electrical contacts of the probe side layer electrical contacts. An electrically conductive signal via extends from the back side layer to the probe side layer. The electrically conductive signal via is electrically connected to the signal conductor of the connector, and is also electrically connected to the centrally disposed signal electrical contact of the probe side layer electrical contacts. The electrically conductive signal via does not make electrical connection with the electrically conductive layer on the back side or on the probe side.

A first of electrically conductive pins is electrically connected to the signal electrical contact, for making an electrical connection with an electrically conductive structure to be tested on the package substrate. Others of the electrically conductive pins are electrically connected to the ground electrical contacts, for making electrical connections with electrically conductive structures on the package substrate that surround the electrically conductive structure to be tested on the package substrate.

In this manner, a single electrical structure on the package substrate, such as an electrical trace, can be probed with the centrally disposed signal pin, while the other ground pins make contact with the surrounding contacts on the package substrate, where the electrical connections to all of the surrounding contacts are tied together. Thus, the package substrate can be quickly and easily probed, and time domain reflectometry measurements can be readily taken. Once this probe setup is attached to an automatic XYZ positioner, time domain reflectometry measurements can be performed automatically. This setup improves the accuracy of the measured wave forms due to the ability of the setup to ground the surrounding conductive structures while probing the structure of interest. Therefore, more accurate measurements can be taken in a given amount of time, providing for a more complete investigation of the package substrate and the package substrate design.

In various preferred embodiments of the invention, the electrically conductive layer is two electrically conductive layers separated by an intervening non electrically conductive layer, where the two electrically conductive layers are electrically connected by electrically conductive vias, with a vertical impedance between the signal via and ground via of about fifty ohms. Preferably, the probe structure is about fifteen millimeters by about fifteen millimeters in size. The probe structure size can be adjusted for other applications. In one embodiment the electrically conductive layer is a metal plane. The connector is preferably a fifty ohm subminiature version A connector. The non electrically conductive back side layer and the non electrically conductive probe side layer are most preferably formed of a solder mask material.

The electrically conductive pins are preferably either cobra pins or pogo pins. Any contact pins with some compliance can be used as well. Most preferably, the electrically conductive contacts on the non electrically conductive probe side layer are disposed at a pitch adapted for testing a ball grid array side of the package substrate, but are alternately disposed at a pitch adapted for testing a solder on pad die side or electrically conductive die side pad of the package substrate. The electrically conductive contacts on the non electrically conductive probe side layer may also be disposed at a pitch of one of about eight tenths of millimeter, about one millimeter, and about one and twenty-seven hundredths of a millimeter.

According to another aspect of the invention there is described a system for testing the impedance of a package substrate using time domain reflectometry. A time domain reflectometry test station is electrically connected to a probe structure via a connector, where the connector has a signal conductor and a ground conductor. A non electrically conductive back side layer is physically connected to the connector. A non electrically conductive probe side layer with electrically conductive contacts is sandwiched with the non electrically conductive back side layer in a layered substrate. The non electrically conductive probe side layer has a centrally disposed signal electrical contact and surrounding ground electrical contacts.

An electrically conductive layer is disposed between the back side layer and the probe side layer. The electrically conductive layer is electrically connected to the ground conductor of the connector. The electrically conductive layer is also electrically connected to the ground electrical contacts of the probe side layer electrical contacts. An electrically conductive via extends from the back side layer to the probe side layer. The electrically conductive via is electrically connected to the signal conductor of the connector, and is also electrically connected to the centrally disposed signal electrical contact of the probe side layer electrical contacts. The electrically conductive via does not make electrical connection with the electrically conductive layer.

A first of electrically conductive pins is electrically connected to the signal electrical contact, for making an electrical connection with an electrically conductive structure to be tested on the package substrate. Others of the electrically conductive pins electrically are connected to the ground electrical contacts, for making electrical connections with electrically conductive structures on the package substrate that surround the electrically conductive structure to be tested on the package substrate.

Preferably, an XYZ stage moves the package substrate under the probe structure, thereby enabling the automated testing of multiple electrically conductive structures to be tested on the package substrate Most preferably, a pattern recognition system aligns the electrically conductive pins to the electrically conductive structures on the package substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
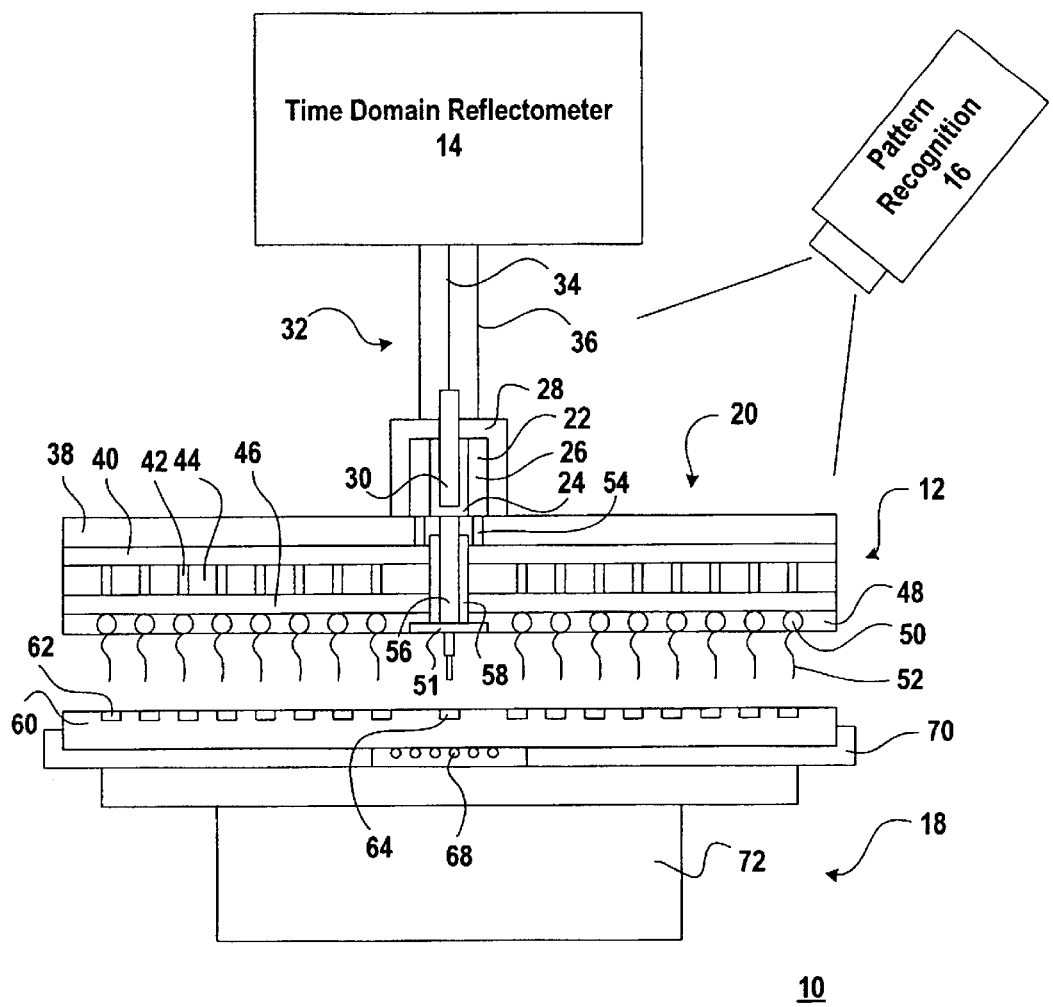
FIG. 1 is a cross sectional view of a probe structure according to the present invention.

With reference now to FIG. 1, there is depicted a cross sectional view of a probe structure 20 according to the present invention, with a functional block diagram of other parts of a system 10 that uses such a probe structure 20. The probe structure 20 is preferably electrically connected to a time domain reflectometer test station 14 via a cable such as a coaxial cable 32, having a center conductor 34 and a sheath conductor 36. The coaxial cable 32 is preferably terminated with a connection such as a fifty ohm subminiature version A connector having a center pin 30 electrically connected to the center conductor 34 and a cap 28 electrically connected to the sheath conductor 36. This connector is electrically connected to a connector 22 attached to the probe structure 20, having a signal conductor 24 electrically connected to the center pin 30 and a ground conductor 26 electrically connected to the cap 28.

The connector 22 is connected to a layered substrate 12 of the probe structure 20. Preferably, the layered substrate 12 of the probe structure 20 has a non electrically conductive back side layer 38, which is most preferably made of a solder mask material. The layered substrate 12 also has a non electrically conductive probe side layer 48, which is also preferably formed of a solder mask material.

Disposed within the probe side layer 48 are electrically conductive contacts, including a centrally disposed signal electrical contact 51 and surrounding ground electrical contacts 50. The contacts 50 and 51 are electrically connected to electrically conductive pins 52, such as the cobra pins connected to the surrounding ground electrical contacts 50 as depicted, or a pogo pin such as connected to the central signal electrical contact 51 as depicted. It is appreciated that other types of pins providing generally the same functionality as those described herein could also be employed. It is further appreciated that such pins could be used in any combination, and the invention is not limited to the specific arrangement and selection of pins 52 as depicted in FIG. 1.

Disposed between the back side layer 38 and the probe side layer 48 is an electrically conductive layer, which is preferably formed of three layers as depicted in FIG. 1. The first of these three layers is an electrically conductive layer 40, which is electrically connected by electrical conductors 54 to the ground conductor 26 of the connector 22. The electrically conductive layer 40 is electrically connected to another electrically conductive layer 46 by electrically conductive vias 42, which make such electrical connections through an intervening non electrically conductive layer 44.

There is preferably a vertical impedance of about fifty ohms between the two electrically conductive layers 40 and 46 as established through the via 56 and vias 42, although the spacing and formation of the vias 42 could be adjusted to provide other impedance values. The electrically conductive layers 40 and 46 are most preferably formed of metal planes. The intervening non electrically conductive layer 44 is preferably made of a material such as FR4, FR5, or TEFLON. The electrically conductive layer 46 is electrically connected to the surrounding ground electrical contacts 50. Thus, there is a common electrical ground connection from the time domain reflectometer 14 to all of the pins 52 that are connected to the surrounding ground electrical contacts 50.

The signal conductor 24 of connector 22 is electrically connected to an electrically conductive via 56 which extends from the back side layer 38 through the probe side layer 48, but which is electrically insulated from the electrically conductive layers 40 and 46, such as by a non electrically conductive insulator material 58. The electrically conductive via 56 is electrically connected to the centrally disposed signal electrical contact 51, as depicted. Thus, there is an electrical connection from the pin 52 connected to the centrally disposed signal electrical contact 51 to the time domain reflectometer 14, which is a separate circuit path from the common ground circuit path described above.

Also depicted in FIG. 1 is a package substrate 60 to be tested, with electrically conductive structures 62, such as electrically conductive pad connected to electrically conductive traces. One of the electrically conductive structures 64, or a structure connected to it, is to be tested using the system 10. The structure 64 to be tested is aligned so as to be underneath the centrally disposed pin 52 that is connected to the signal conductor 24. The other pins 52 are disposed with a pitch so as to make electrical connections with the surrounding electrical structures 62 on the package substrate 60. Thus, the pitch of the pins 52 may be such as to probe the ball grid array of the package substrate 60, or may alternately be pitched to probe the solder on pad bump side 68 of the package substrate 60. Preferably, the pin 52 pitch is one of about eight tenths of a millimeter, about one millimeter, and about one and twenty-seven hundredths of a millimeter. This pin 52 pitch can be varied to obtain other pin sizes.

The package substrate 60 is preferably held by a substrate holder 70, which is attached to a pedestal 72. These elements represent an XYZ stage 18 which can index the package substrate 60 beneath the probe structure 20, so that different ones of the electrical contacts 62 on the surface of the package substrate 60 can be electrically tested with the centrally disposed pin 52. Preferably, such testing and indexing is accomplished automatically under the control of a controller, such as may be included within the time domain reflectometer test station 14.

Most preferably the system 10 also includes a pattern recognition system 16 for aligning the electrically conductive pins 52 to the electrically conductive structures 62 on the package substrate 60, as they are indexed by the XYZ stage 18 under the probe structure 20.

Figure 2:
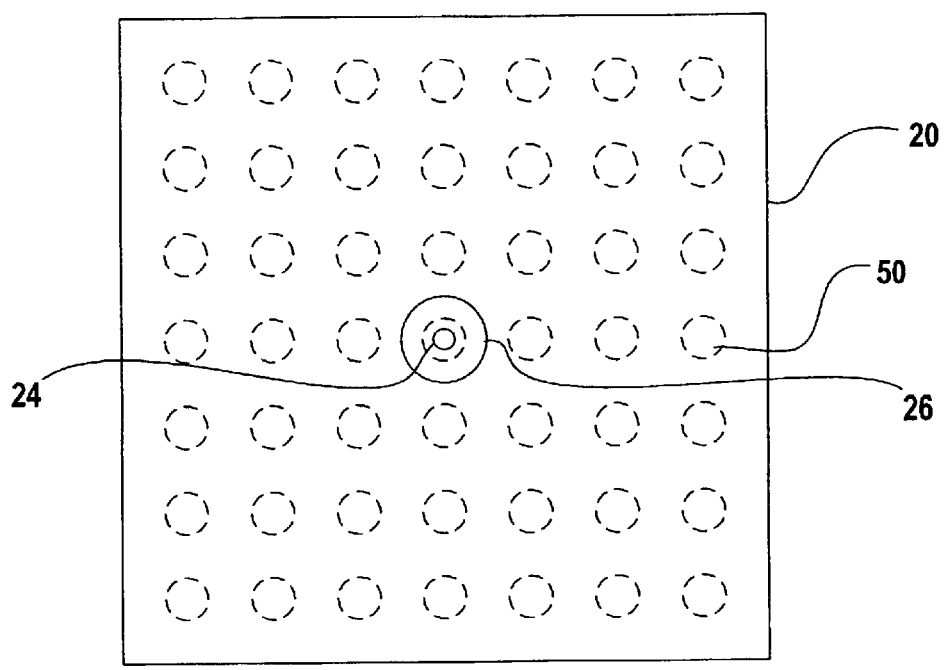
FIG. 2 is a top plan view of the probe structure according to the present invention.

FIG. 2 representationally depicts the probe structure 20 from a top view. Depicted is the connector 22, including the signal conductor 24 and the ground conductor 26. Also depicted in phantom are the are the electrically conductive contacts 50 disposed on the bottom of the probe structure 20. It is appreciated that the layout of the conductive contacts 50 as depicted in FIG. 2 is representational only, and in actual implementation the layout of the conductive contacts 50 may take one or more a variety of different forms, preferably dependant at least in part upon the configuration of the electrically conductive structures 62 on the package substrate 60 to be probed.

In a preferred embodiment, the probe structure 20 is about fifteen millimeters by about fifteen millimeters in size. However, it is appreciated that other sizes can be used as well. Further, the number of contacts 50 as depicted in FIG. 2 is not by way of limitation, but rather is representational only. In addition, the probe structure 20 need not be rectilinear as depicted, but may alternately be formed in another shape, such as circular. As depicted in FIG. 1, the probe structure 20 is roughly the same size as the package substrate 60 to be tested. However, it is appreciated that the probe structure 20 may alternately be either larger than or smaller than the package substrate 60 to be tested.

The system 10 as described allows a signal to be launched to and received from a pad 62 on the package substrate 60 while at the same time grounding the surrounding pads, such as Vss pads, Vdd pads, and other signal pads within a predefined region, to the outer conductor of the fifty ohm coaxial cable connected to the connector 22. Thus, time domain reflectometry measurements are easily and accurately made to determine, for example, the characteristic impedance ($Z_0$) of the traces in the package substrate 60. A discussion of time domain reflectometry is left to other sources.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations arc within the scope of the invention as determined by the appended claims when interpreted in accordance with the breadth to which they are fairly, legally, and equitably entitled.

What is claimed is:

1. A probe structure for testing impedance of a package substrate using time domain reflectometry, the probe structure comprising:
    a connector for electrically connecting the probe structure to a time domain reflectometry tester, the connector having a signal conductor and a ground conductor,
    a layered substrate having,
        a non electrically conductive back side layer physically connected to the connector,
        a non electrically conductive probe side layer with electrically conductive contacts, including a centrally disposed signal electrical contact and surrounding ground electrical contacts,
        an electrically conductive layer disposed between the back side layer and the probe side layer, the electrically conductive layer electrically connected to the ground conductor of the connector, the electrically conductive layer also electrically connected to the ground electrical contacts of the probe side layer electrical contacts, and
        an electrically conductive via extending from the back side layer to the probe side layer, the electrically conductive via electrically connected to the signal conductor of the connector, the electrically conductive via also electrically connected to the centrally disposed signal electrical contact of the probe side layer electrical contacts, and the electrically conductive via not making electrical connection with the electrically conductive layer, and
    electrically conductive pins,
        a first of the electrically conductive pins electrically connected to the signal electrical contact, for making an electrical connection with an electrically conductive structure to be tested on the package substrate, and
        others of the electrically conductive pins electrically connected to the ground electrical contacts, for making electrical connections with electrically conductive structures on the package substrate that surround the electrically conductive structure to be tested on the package substrate.

2. The probe structure of claim 1, wherein the electrically conductive layer comprises two electrically conductive layers separated by an intervening non electrically conductive layer, the two electrically conductive layers electrically connected by electrically conductive vias, with a vertical impedance between the two electrically conductive layers of about fifty ohms.

3. The probe structure of claim 1, wherein the probe structure is about fifteen millimeters by about fifteen millimeters in size.

4. The probe structure of claim 1, wherein the electrically conductive layer comprises a metal plane.

5. The probe structure of claim 1, wherein the connector is a fifty ohm subminiature version A connector.

6. The probe structure of claim 1, wherein the non electrically conductive back side layer is formed of a solder mask material.

7. The probe structure of claim 1, wherein the non electrically conductive probe side layer is formed of a solder mask material.

8. The probe structure of claim 1, wherein the electrically conductive pins comprise cobra pins.

9. The probe structure of claim 1, wherein the electrically conductive pins comprise pogo pins.

10. The probe structure of claim 1, wherein the electrically conductive contacts on the non electrically conductive probe side layer are disposed at a pitch adapted for testing a ball grid array side of the package substrate.

11. The probe structure of claim 1, wherein the electrically conductive contacts on the non electrically conductive probe side layer are disposed at a pitch adapted for testing a solder on pad die side of the package substrate.

12. The probe structure of claim 1, wherein the electrically conductive contacts on the non electrically conductive probe side layer are disposed at a pitch of one of about eight tenths of millimeter, about one millimeter, and about one and twenty-seven hundredths of a millimeter.

13. A system for testing impedance of a package substrate using time domain reflectometry, the system comprising:
  a time domain reflectometry test station electrically connected to a probe structure, and
  the probe structure having,
    a connector for electrically connecting the probe structure to the time domain reflectometry tester, the connector having a signal conductor and a ground conductor,
    a layered substrate having,
      a non electrically conductive back side layer physically connected to the connector,
      a non electrically conductive probe side layer with electrically conductive contacts, including a centrally disposed signal electrical contact and surrounding ground electrical contacts,
      an electrically conductive layer disposed between the back side layer and the probe side layer, the electrically conductive layer electrically connected to the ground conductor of the connector, the electrically conductive layer also electrically connected to the ground electrical contacts of the probe side layer electrical contacts, and
      an electrically conductive via extending from the back side layer to the probe side layer, the electrically conductive via electrically connected to the signal conductor of the connector, the electrically conductive via also electrically connected to the centrally disposed signal electrical contact of the probe side layer electrical contacts, and the electrically conductive via not making electrical connection with the electrically conductive layer, and
    electrically conductive pins,
      a first of the electrically conductive pins electrically connected to the signal electrical contact, for making an electrical connection with an electrically conductive structure to be tested on the package substrate, and
      others of the electrically conductive pins electrically connected to the ground electrical contacts, for making electrical connections with electrically conductive structures on the package substrate that surround the electrically conductive structure to be tested on the package substrate.

14. The system of claim 13, further comprising an XYZ stage for moving the package substrate under the probe structure and thereby enabling the automated testing of multiple electrically conductive structures to be tested on the package substrate.

15. The system of claim 13, further comprising a pattern recognition system for aligning the electrically conductive pins to the electrically conductive structures on the package substrate.

16. The system of claim 13, wherein the electrically conductive layer comprises two electrically conductive layers separated by an intervening non electrically conductive layer, the two electrically conductive layers electrically connected by electrically conductive vias, with a vertical impedance between the two electrically conductive layers of about fifty ohms.

17. The system of claim 13, wherein the probe structure is about fifteen millimeters by about fifteen millimeters in size.

18. The system of claim 13, wherein the electrically conductive layer comprises a metal plane.

19. The system of claim 13, wherein the electrically conductive contacts on the non electrically conductive probe side layer are disposed at a pitch adapted for testing a ball grid array side of the package substrate.

20. A system for testing impedance of a package substrate using time domain reflectometry, the system comprising:
  a time domain reflectometry test station electrically connected to a probe structure,
  the probe structure having,
    a connector for electrically connecting the probe structure to the time domain reflectometry tester, the connector having a signal conductor and a ground conductor,
    a layered substrate having,
      a non electrically conductive back side layer physically connected to the connector,
      a non electrically conductive probe side layer with electrically conductive contacts, including a centrally disposed signal electrical contact and surrounding ground electrical contacts,
      an electrically conductive layer disposed between the back side layer and the probe side layer, the electrically conductive layer electrically connected to the ground conductor of the connector, the electrically conductive layer also electrically connected to the ground electrical contacts of the probe side layer electrical contacts, and
      an electrically conductive via extending from the back side layer to the probe side layer, the electrically conductive via electrically connected to the signal conductor of the connector, the electrically conductive via also electrically connected to the centrally disposed signal electrical contact of the probe side layer electrical contacts, and the electrically conductive via not making electrical connection with the electrically conductive layer, and
    electrically conductive pins,
      a first of the electrically conductive pins electrically connected to the signal electrical contact, for making an electrical connection with an electrically conductive structure to be tested on the package substrate, and
      others of the electrically conductive pins electrically connected to the ground electrical contacts, for making electrical connections with electrically conductive structures on the package substrate that surround the electrically conductive structure to he tested on the package substrate,
  an XYZ stage for moving the package substrate under the probe structure and thereby enabling the automated testing of multiple electrically conductive structures on the package substrate, and
  a pattern recognition system for aligning the electrically conductive pins to the electrically conductive structures on the package substrate.

* * * * *